United States Patent [19]

Okumura et al.

[11] Patent Number: 5,156,903
[45] Date of Patent: Oct. 20, 1992

[54] MULTILAYER CERAMIC SUBSTRATE AND MANUFACTURE THEREOF

[75] Inventors: Takamasa Okumura, Nagato; Kohmei Kawaguchi, Nagoya; Masataka Aoki, Mine; Takashi Nagasaka, Anjo; Tohru Nomura, Ohbu; Yoshiyuki Miyase, Okazaki, all of Japan

[73] Assignees: Sumitomo Metal Ceramics Inc., Yamaguchi; Nippon Denso Co., Ltd., Aichi, both of Japan

[21] Appl. No.: 631,853

[22] Filed: Dec. 21, 1990

[30] Foreign Application Priority Data

Dec. 21, 1989 [JP] Japan .................. 1-331791

[51] Int. Cl.⁵ .............................. B32B 9/00
[52] U.S. Cl. .................. 428/209; 428/210; 428/901; 428/697; 428/698; 428/220
[58] Field of Search ............ 428/901, 698, 697, 220, 428/209, 210

[56] References Cited

U.S. PATENT DOCUMENTS

| | | | |
|---|---|---|---|
| 4,340,618 | 7/1982 | Fury et al. | 427/96 |
| 4,493,856 | 1/1985 | Kumar et al. | 427/96 |
| 4,795,670 | 1/1989 | Nishigaki et al. | 428/432 |

Primary Examiner—Patrick J. Ryan
Assistant Examiner—Kam Lee
Attorney, Agent, or Firm—Sughrue, Mion, Zinn, Macpeak & Seas

[57] ABSTRACT

A multilayer ceramic substrate having improved mechanical and electrical properties and suitable for use to form a hybrid integrated circuit and a process for the manufacture thereof. The multilayer ceramic substrate has at least one layer of a first conductor based on a refractory metal as an internal conductor layer and at least one layer of a Cu-based second conductor as a surface conductor layer, wherein the second conductor layer is connected to the first conductor layer through a metallic layer formed by coating with a metalloorganics paste containing one or more metals selected from the group consisting of Pt, Pd, Ni, Cu, Au, Rh, Ru, Re, Co, and Ir followed by firing in an inert or reducing atmosphere.

8 Claims, 3 Drawing Sheets

MULTILAYER CERAMIC SUBSTRATE AND MANUFACTURE THEREOF

BACKGROUND OF THE INVENTION

The present invention relates to a multilayer ceramic substrate suitable for use in the production of electronic components, particularly those having a hybrid integrated circuit, and a process for the manufacture of such a substrate.

A multilayer ceramic substrate for use to form a hybrid integrated circuit comprises at least one ceramic layer as an insulator and at least one internal conductor layer of a first conductor. Each ceramic layer has at least one opening called through hole or via hole which is filled with the first conductor in order to obtain electric continuity between adjacent conductor layers. The exposed surface of the first conductor filled in the opening in the surface ceramic layer is covered with a thick film layer of a second external conductor.

Multilayer ceramic substrates are mainly manufactured by the sheet laminating method or print laminating method. In the sheet laminating method, a multilayer ceramic substrate is manufactured by preparing a plurality of green ceramic sheets each having a printed pattern of a first conductor thereon and at least one through hole filled with the first conductor, stacking and laminating these sheets, sintering the resulting multilayer structure, and applying a second conductor so as to cover the exposed surface of the first conductor. In the print laminating method, the multilayer structure is formed by printing one or more first conductor layers and one or more ceramic insulator layers alternately on a green ceramic sheet.

Since the internal first conductor layers are heated at a high temperature together with the green ceramic sheets when the multilayer structure is sintered, the first conductor is based on a refractory metal such as tungsten or molybdenum having a high melting point so as to avoid melting of the conductor during sintering. The second conductor can be based on silver or other noble metals.

These conventional multilayer ceramic substrates have the disadvantage that they have a high contact resistance and a low bonding strength between the first and the second conductor layers, particularly when the exposed surface of the first conductor layer is oxidized.

In order to overcome this problem, it has been proposed that a Cu-based material is used to form the second conductor since it can be fired in a nitrogen atmosphere so as to prevent oxidation.

Furthermore, in order to improve the reliability of mechanical and electrical connection between the first and second conductors, it has been attempted to interpose a metallic layer between these two conductors. The metallic layer is formed on the exposed surface of the first conductor layer of the multilayer structure, i.e., in the vicinity of through hole areas of the surface insulator layer.

For example, Japanese Utility Model Application Kokai No. 57-12775(1982) discloses that a metallic layer which may be comprised of a single nickel layer or a combination of a nickel layer and a gold layer is interposed between the first and second conductors. The metallic layer is formed by electrolytic or electroless plating or vacuum evaporation.

Japanese Patent Publication No. 63-42879(1988) discloses that a metallic layer of nickel, cobalt, or copper having a thickness of from 0.2 to 5 μm is formed by electrolytic or electroless plating on the exposed surface of the first conductor layer. Similarly, Japanese Patent Application Kokai No. 51-133766(1976) discloses a metallic layer formed by plating with a metal such as nickel, copper, or silver and having good wettability with the first conductor layer.

The metallic layer described in Japanese Patent Application Kokai No. 59-171195(1984) has a nickel plating layer and a silver- or gold-containing noble metal layer formed thereon. The noble metal layer can be formed by placing a noble metal foil, or plating, or printing with a thick film noble metal paste. Similarly, Japanese Patent Publication No. 1-48672(1989) discloses the formation of a metallic layer by nickel plating followed by printing with a thick film nickel paste.

These methods for the formation of a metallic layer between the first and second conductors involve various problems.

Electroless plating is accompanied by undesirable extension of the plated layer by bleeding from the through hole area to a surrounding area. In addition, the plated metal tends to diffuse toward the surface of the second conductor layer, thereby deteriorating the wettability of the surface by a solder which is required at a later stage.

Electrolytic plating causes mechanical and electrical problems such as a restriction in the dimensions of the substrate or an increase in the stray capacity because lead wires must be connected to perform the plating. Furthermore, such wiring makes the manufacturing process more complicated and the above-mentioned deterioration in wettability by a solder is also inevitable.

In the plating method, a plating solution is used irrespective of the type (electroless or electrolytic). When the exposed surface of the first conductor layer that is the surface to be plated has depressions as indicated in FIG. 5 by the numeral 8, the plating solution may remain in the depressions 8. In this case, the quality of the resulting multilayer ceramic substrate may be degraded due to discoloration of the outer surface of the substrate or oxidation of the conductor layers.

Vacuum evaporation is not an efficient method and deteriorates the productivity.

SUMMARY OF THE INVENTION

It is an object of the present invention to provide a multilayer ceramic substrate having good electrical and mechanical properties and improved reliability.

Another object of the present invention is to provide a multilayer ceramic substrate which can be manufactured with a high productivity.

A further object of the invention is to provide a multilayer ceramic substrate having an improved metallic layer between the first and second conductors which can be formed by a simple application technique such as screen printing.

A still further object of the invention is to provide a process for the manufacture of such a multilayer ceramic substrate.

In one aspect, the present invention provides a multilayer ceramic substrate having at least one layer of a first conductor based on a refractory metal as an internal conductor layer and at least one layer of a Cu-based second conductor as a surface conductor layer, wherein the second conductor layer is connected to the first conductor layer through a metallic layer formed by coating with a metallo-organics paste containing one or more metals selected from the group consisting of Pt, Pd, Ni, Cu, Au, Rh, Ru; Re, Co, and Ir followed by firing in an inert or reducing atmosphere.

The multilayer ceramic substrate can be manufactured by a process comprising: preparing a co-fired multilayer structure having at least one layer of a first conductor based on a refractory metal and at least one ceramic insulator layer having one or more through holes filled with the first conductor; applying the above-mentioned metallo-organics paste to a portion of the surface of the co-fired multilayer structure on which the first conductor is exposed; firing the applied metallo-organics paste in an inert or reducing atmosphere to form a metallic layer on the exposed first conductor; and applying a Cu-based paste in a predetermined pattern covering the metallic layer followed by firing, thereby forming a Cu-based second conductor layer which is connected to the first conductor layer through the metallic layer.

DESCRIPTION OF THE PREFERRED EMBODIMENT

Now the present invention is described in details while referring to the accompanying drawings.

Figure 1:
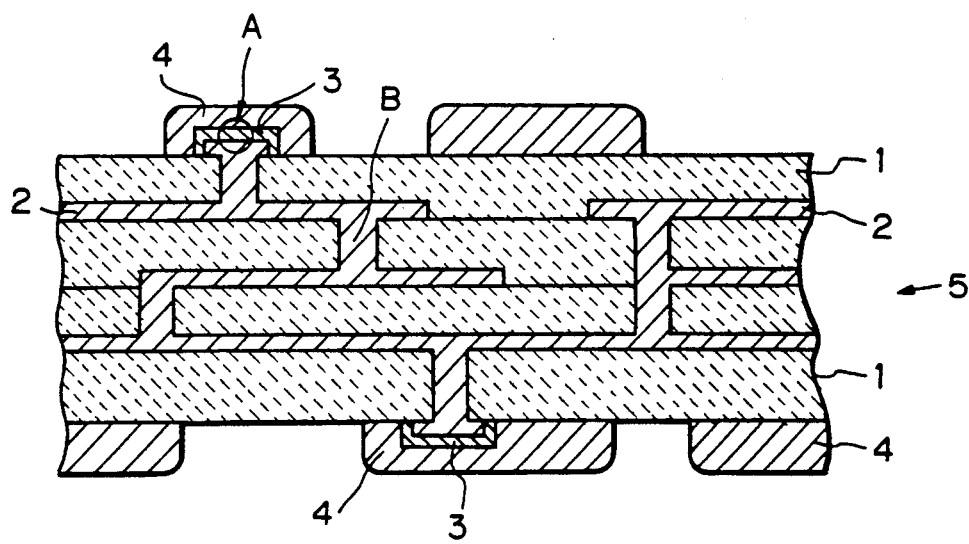
FIG. 1 is a partial schematic cross-sectional view of a multilayer ceramic substrate according to the present invention.

FIG. 1 shows a schematic cross-sectional view of a multi-layer ceramic substrate according to the present invention. The multilayer ceramic substrate comprises one or more insulator layers 1 (four insulator layers shown in this figure) made of a ceramic material such as an alumina- or beryllia-based ceramic. Each insulator layer has one or more openings (through holes) as indicated by B.

The substrate has at least one layer of a first conductor 2 as an internal conductor layer. The first conductor layer 2 is based on a refractory metal such as tungsten (W), molybdenum (Mo) or a mixture of these metals, and is located on each insulator layer 1 in a predetermined pattern in such a manner that every through hole B in the insulator layer is filled with the first conductor, thereby obtaining electric continuity across the substrate. The substrate shown in FIG. 1 has five first conductor layers 2, three between adjacent insulator layers 1 and two on the opposite external or surface insulator layers.

Each of the first conductor layers 2 on the surface insulator layers is covered with a metallic layer 3 and connected to a layer of a second conductor 4 based on copper (Cu) through the metallic layer 3.

According to the present invention, the metallic layer 3 between the first conductor layer 2 and the second conductor layer 4 is formed by coating with a metallo-organics paste containing one or more metals selected from the group consisting of Pt, Pd, Ni, Cu, Au, Rh, Ru, Re, Co, and Ir followed by firing. Preferably the metallic layer 3 has a thickness in the range of from 0.05 to 5 $\mu$m, more preferably in the range of from 1 to 3 $\mu$m, and most preferably approximately 2 $\mu$m.

The metallo-organics paste which is also called a metal resinate is a homogeneous resin-like paste which contains one or more metals in the form of a metal complex. In a usual organometallic compound, the metal is attached to an organic radical through a carbon atom of the radical. In the metallo-organics paste, however, the metal is coordinated with one or more organic ligands through a hetero atom such as oxygen, sulfur, nitrogen, or phosphorus as illustrated below:

$$R-\underset{\underset{O}{\|}}{C}-O-Me-\underset{\underset{O}{\|}}{C}-R \quad (I)$$

$$R-S-Me-S-R \quad (II)$$

$$R-N-Me \quad (III)$$

The metal complex can be prepared by reacting an inorganic metal compound with an organic ligand. Preferably, the metal complex contains a metal linked to the organic ligand through an oxygen atom as exemplified in the above formula (I) since such a linkage has a high susceptibility to thermal decomposition, thereby promoting firing.

Unlike thick film metal pastes conventionally employed in screen printing of a conductor pattern, the metallo-organics paste is free from glass frit or fine particles of a metal or metal oxide since the metal is dissolved as a homogeneous solution in the form of a metal complex with an organic compound and hence it can be screen-printed into a glass-free, thin, dense film with a submicron thickness, e.g., on the order of 0.05 to 5 $\mu$m. Such a thin, dense metal film is usually obtained by plating and cannot be formed from a conventional thick film paste.

If the metallic layer 3 is formed from a conventional thick film paste, it will not have a dense structure since the thick film paste is a heterogeneous dispersion of fine metal powder containing glass frits as a binder. Therefore, the resulting metallic layer will not provide good bonding properties between the first and second conductor layers.

Various metallo-organics pastes are commercially available. They have a metal content of from several percents to several tens percents by weight.

Metallo-organics pastes have been developed mainly for the purpose of printing a microcircuit, but it has not been attempted in the art that a metallo-organics paste is used to form a metallic layer between two conductor layers in order to improve the reliability of connection as in the present invention.

The multilayer ceramic substrate of the present invention can be manufactured in a conventional manner except that a metallic layer between the first and the second conductor layers is formed from a metallo-organics paste.

In a process for the manufacture of a ceramic multilayer substrate 5 as shown in FIG. 1, a co-fired multilayer structure having at least one layer of a first conductor 2 based on a refractory metal such as W, Mo, or a mixture of W and Mo and at least one ceramic insulator layer 1 is prepared. Each insulator layer has one or more through holes B filled with the first conductor. Such co-fired multilayer substrate can be prepared by the sheet laminating method or print laminating method.

In the sheet laminating method, a co-fired multilayer structure is prepared by forming one or more ceramic green sheets each having at least one through hole, applying a printed pattern of a paste based on a refractory metal to each ceramic green sheet and filling each through hole thereof with the paste, stacking and laminating the green sheets, for example, by hot pressing, when two or more sheets are present, and sintering the resulting multilayer structure.

In the print laminating method, a thick ceramic green sheet is used as a base sheet. The base sheet is screen printed with a paste based on a refractory metal and a ceramic paste alternately so as to form on the base sheet one or more layers of conductor pattern separated by an insulator layer having through holes. The through holes in the insulator layer are filled with the conductor of the overlying conductor layer. The resulting multilayer structure is then sintered to give a co-fired multilayer structure.

The green ceramic sheet may be prepared in a conventional manner, for example, by tape forming using a doctor blade. The paste based on a refractory metal may be a commercially available thick film paste containing W or Mo or both and it can be conveniently applied by screen printing.

The above-mentioned metallo-organics paste is then applied to a portion of the surface of the co-fired multilayer structure on which the first conductor is exposed, thereby covering the entire exposed surface of the first conductor with the metallo-organics paste, which is then fired in an inert or reducing atmosphere to form a metallic layer 3 over the exposed first conductor layer. The metallo-organics paste can be applied by screen printing, coating from a dispenser, or a similar method. Thus, the application can be easily and efficiently performed since there is no need to control the temperature, pH, and other conditions, unlike plating which requires to control a plating solution. The applied metallo-organics paste is usually fired at a temperature between 700° C. and 1100° C. after the organics present in the paste have been removed by heating at a temperature between 100° C. and 500° C.

Subsequently, a Cu-based paste is applied on the outer surface of the multilayer structure in a predetermined pattern covering the metallic layer. After firing, a Cu-based second conductor layer 4 connected to the first conductor layer 2 through the metallic layer 3 is formed.

Although not shown in FIG. 1, the resulting multilayer ceramic substrate 5 may have one or more resistor layers, one or more glass layers protecting the resistor layers, and one or more overcoat resin layers on the outer surfaces of the substrate.

Figure 2:
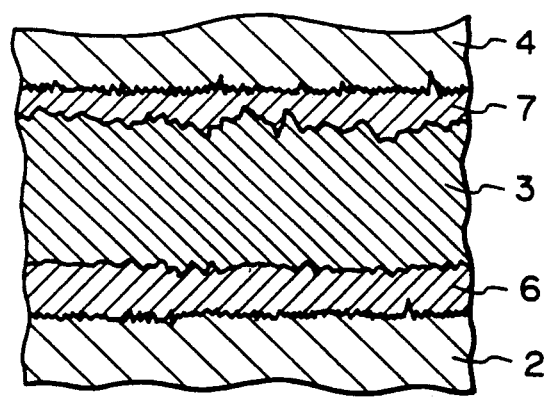
FIG. 2 is an enlarged view of a portion of FIG. 1 indicated by A.

The detailed cross-sectional structure of the metallic layer 3 of the multilayer ceramic substrate of the present invention is shown in FIG. 2 which is a partial enlarged view of a portion of FIG. 1 indicated by A. As shown in FIG. 2, the metallic layer 3 formed from a metallo-organics paste has a contour conforming to the unevenness of the rough, irregular surface of the first conductor layer 2 formed from a thick film paste and it completely penetrates into any depression on the surface of the first conductor layer 2. Furthermore, the metallic layer 3 is capable of exhibiting a mechanical anchoring effect during firing and forming a solid solution with the first conductor layer 2 to produce a solid solution layer 6 at the interface between the metallic layer 3 and the first conductor layer 2. Similarly, the metallic layer 3 can exhibit a mechanical anchoring effect with the second conductor layer 4 during firing of this conductor layer, thereby forming a solid solution layer 7 at the interface between the metallic layer 3 and the second conductor layer 4.

The multilayer ceramic substrate of the present invention has a high bonding strength between the first and second conductor layers due to the presence of the interposed metallic layer formed from a metallo-organics paste. The bonding strength between the first and second conductor layers is generally in the range of 7–13 kg/2 mm-square as measured with a test piece having a copper wire soldered over the second conductor layer in a 2 mm square shape. A similar test piece having a metallic layer 3 formed by plating has a bonding strength in the range of 5–7 kg/2 mm-square. When the metallic layer is formed from a thick film paste containing dispersed metal powder, the metallic layer formed does not have a dense structure and the bonding strength of the resulting multilayer substrate is as low as 2–3 kg/2 mm-square.

Figure 4:
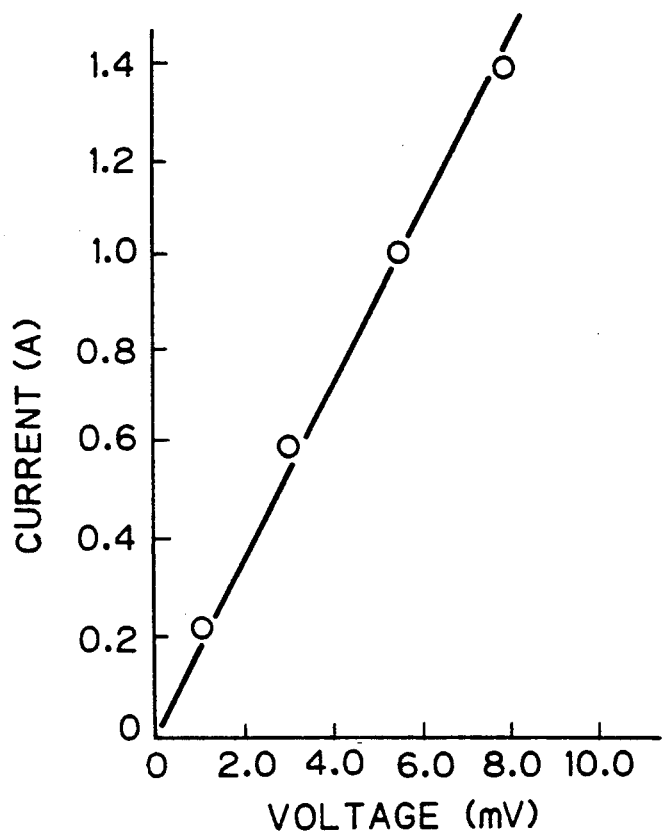
FIG. 4 shows a voltage-current diagram of the relationship between the W-based first conductor layer and the Cu-based second conductor layer of the multilayer ceramic substrate prepared in Example 1.
Figure 5:
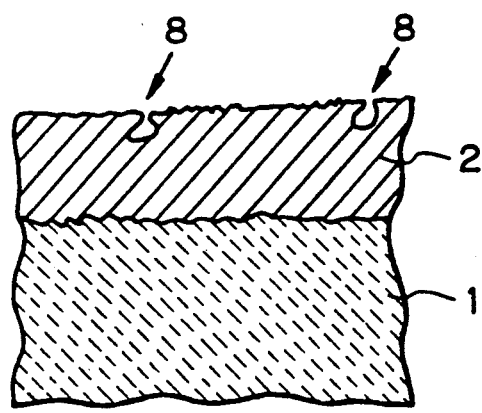
FIG. 5 is a schematic cross-sectional view showing the surface of a first conductor layer on an insulator layer when a metallic layer is applied thereon by plating according to a conventional process.

By the above-mentioned mechanical anchoring effect of the metallic layer which is accompanied by the formation of a solid solution or alloying with the adjacent conductor layers, the metallic layer can produce an ohmic contact between the first and second conductor layers as shown in FIG. 4.

Therefore, the metallo-organics paste is preferably so selected that the metal present therein can form a solid solution with at least one, and more preferably both, of the metals present in the first and second conductors.

Another advantage of the multilayer ceramic substrate of the present invention is that when the metallo-organics paste applied over the exposed surface of the first conductor layer extends to a surrounding area on the insulator layer, for example, due to a positioning error in screen printing or bleeding of the paste, it does not firmly adhere to the insulator layer after firing so that the metallic layer formed in undesired areas can be readily removed from the surface of the insulator layer by means of ultrasonic cleaning, brushing, or the like. Therefore, the metallic layer can be formed only in the desired areas covering the exposed first conductor, thereby eliminating a deterioration in electrical or mechanical properties of the substrate caused by the presence of the metallic layer in an undesired area.

As a result of the above-mentioned various advantages, the multilayer ceramic substrate according to the invention has improved electrical and mechanical properties in a stable manner so that a product having a reliable quality can be manufactured with a high productivity without use of a plating solution.

EXAMPLE 1

A co-fired multilayer structure is prepared by the sheet laminating method as follows.

A plurality of green ceramic sheets to form insulator layers each having one or more through holes are prepared from an alumina-based slurry containing a sintering aid such as silica or calcia and an organic binder by the tape forming method using a doctor blade. A commercially available W-based thick film paste to form a first conductor layer 2 is screen-printed on one surface of each green ceramic sheet to form a desired printed conductor pattern and fill through holes B of the ceramic sheet with the paste. After the printed ceramic sheets are stacked and laminated, the resulting multilayer structure is sintered at a temperature of 1400° C.–1700° C. in a reducing atmosphere such as a hydrogen atmosphere to give a co-fired multilayer structure in which the insulator layers 1 and first conductor layers 2 are bonded together into an integral body.

The exposed surface of the first conductor layer 2 on the outer surface of the co-fired multilayer structure which is not covered with an insulator layer is then coated with a commercially available platinum (Pt) metallo-organics paste by screen printing. After the coating is heated at a temperature of about 400° C. for 10 minutes in an oxidizing atmosphere to remove organic components therefrom, it is fired at a temperature of 1000° C. for 10 minutes in a nitrogen or hydrogen atmosphere to form a metallic layer which covers the exposed surface of the first conductor layer. The thickness of the metallic layer is approximately 2 μm.

The substrate is then subjected to ultrasonic cleaning in order to remove the metallic layer deposited in undesired areas on the surface insulator layer.

Thereafter, a Cu-based thick film paste, e.g., #9922 Copper Paste sold by Du Pont is applied by printing such as screen printing in a predetermined pattern to form a desired conductor pattern covering the metallic layer 3. The applied paste is fired at 900° C. for 10 minutes in a nitrogen atmosphere to form a second conductor layer 4. The resulting ceramic multilayer substrate has the first and second conductor layers connected through the metallic layer formed from the Pt metallo-organics paste.

Although not shown, a resistor layer, a glass layer to protect the resistor layer, and an overcoat resin layer may be formed on the outer surface of the multilayer substrate as required.

The Pt metal in the metallo-organics paste used in this example can readily diffuse into both the W metal in the first conductor layer and the Cu metal in the second conductor layer by heating. Therefore, a solid solution is formed at the interface between the metallic layer and the first or second conductor layer during firing of the metallic layer and the second conductor layer, thereby exerting the mechanical anchoring effect. The metallic layer is mechanically and electrically stable and firmly joins the first and second conductor layers.

COMPARATIVE EXAMPLE 1

For comparison, a ceramic multilayer substrate is fabricated in the same manner as described in Example 1 except that no metallic layer is formed between the first and second conductor layers.

Figure 3:
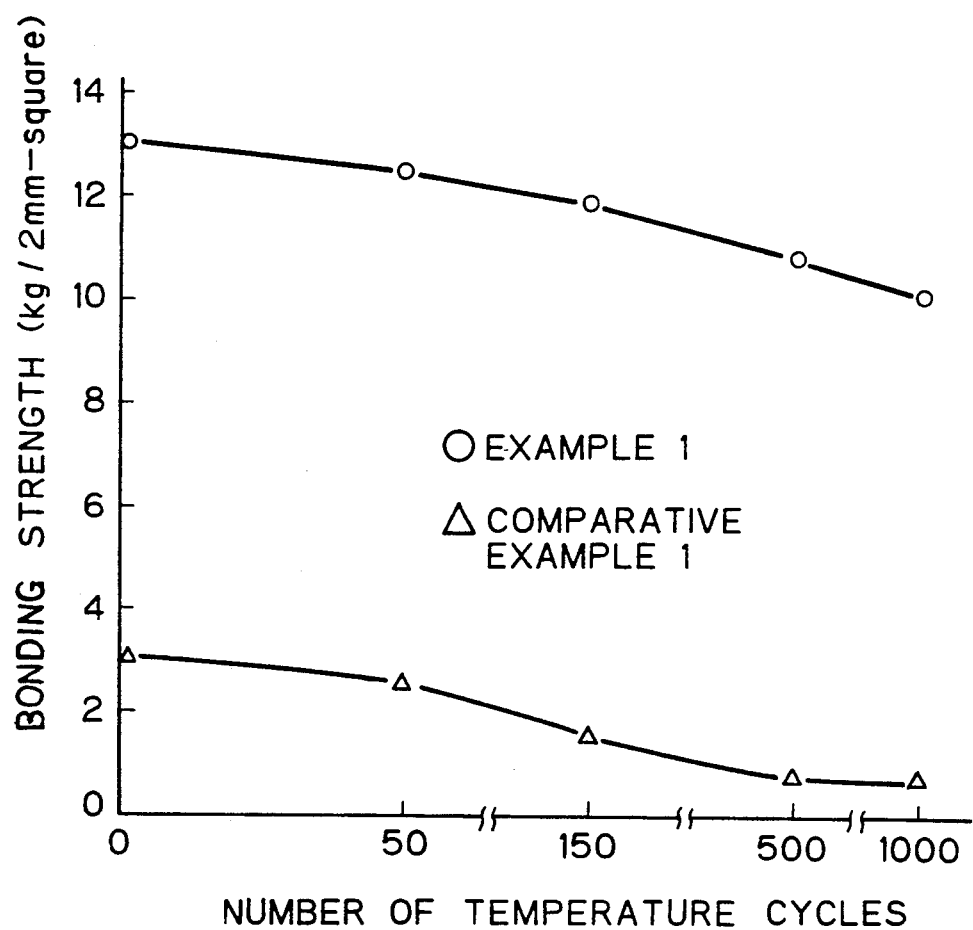
FIG. 3 shows the change in bonding strength of the multilayer ceramic substrates prepared in Example 1 and Comparative Example 1 in a temperature cycle test.

FIG. 3 shows the change of the bonding strength of the multilayer substrates prepared in Example 1 and Comparative Example 1 from the initial strength while they were subjected to 1000 cycles in a temperature cycle test between −40° C. and 150° C.

The multilayer substrate of Example 1 had an initial bonding strength of about 13.0 kg/2 mm-square which was much greater than the initial bonding strength of the multilayer substrate of Comparative Example 1 and it retained a sufficiently high bonding strength on the order of 10.0 kg/2 mm-square after 1000 cycles. In contrast, the bonding strength of the multilayer substrate of Comparative Example 1 which was initially as low as 3.0 kg/2 mm-square decreased by about 50% after 150 cycles and it further decreased after it was subjected to additional cycles.

FIG. 4 shows the voltage-current characteristic diagram between the W-based first conductor layer and the Cu-based second conductor layer of the multilayer ceramic substrate of Example 1. As can be seen from FIG. 4, the voltage and current showed a linear relationship, which indicates that the connection between the first and second conductor layers through the metallic layer formed from a Pt metallo-organics paste provides an excellent ohmic contact, which is important to a multilayer substrate for achieving the desired performance.

The quality of the multilayer ceramic substrate of Example 1 is examined for (1) a short-circuiting failure due to bleeding of any metal layer and (2) a deterioration failure causing a substantial decrease in surface insulation resistance which are main qualitative defects of a multilayer ceramic substrate. It shows 0% defective in each of the short-circuiting failure and the deterioration failure. On the other hand, when the metallic layer is formed by plating according to a conventional method, the resulting multilayer substrate shows from 15% to 60% defective in each of the short-circuiting and deterioration failures. Thus, the multilayer ceramic substrate according to the present invention has good quality and can be manufactured with a high productivity.

EXAMPLE 2

A ceramic multilayer substrate is fabricated in the same manner as described in Example 1 except that the first conductor layer is formed from a Mo-based thick film paste and that the metallic layer is formed by coating with a commercially available palladium (Pd) metallo-organics paste using a dispenser, then heating at 350° C.–450° C. for 10 minutes to remove organic components, and firing at a temperature of about 900° C. for 10 minutes in a hydrogen atmosphere. The metallic layer has a thickness of about 2 μm.

The resulting multilayer ceramic substrate has improved properties comparable to those of the product of Example 1.

Like the Pt metallo-organics paste employed in Example 1, the Pd metallo-organics paste can readily diffuse into both the first and second conductor layers to form a solid solution with Mo in the first conductor layer and Cu in the second conductor layer, and it has a mechanical anchoring effect such that the metallic layer is electrically and mechanically stable and firmly binds the two conductor layers.

EXAMPLE 3

A co-fired multilayer structure is prepared by the print laminating method in the following manner.

An alumina-based ceramic green sheet as a base insulator sheet is screen-printed with a metallizing paste based on a refractory metal such as W or Mo to form a printed conductor pattern of a first conductor. An alumina-based ceramic paste is then screen-printed over the metallizing paste layer to form an insulator layer. The screen printing with the metallizing paste and the ceramic insulating paste may be repeated alternately one or more times. The resulting multilayer structure is sintered at a temperature of 1400° C.–1700° C. in a reducing atmosphere such as a hydrogen atmosphere for a period sufficient to form a co-fired multilayer substrate having first conductor layers based on a refractory metal integrated with insulator layers.

Onto the co-fired multilayer structure, a metallic layer and a second conductor layer are formed in the same manner as in Example 1 to form a multilayer ceramic substrate. The substrate has good quality and its properties are comparable to those of the product of Example 1.

EXAMPLE 4

A ceramic multilayer substrate is fabricated in the same manner as described in Example 1 except that the metallic layer is formed from a metallo-organics paste based on a metal selected from Ni, Cu, Au, Rh, Ru, Re, Co, and Ir. The bonding strength between the first and second conductor layers of each of the resulting multilayer substrates is shown in Table 1 together with the results of Examples 1 and 2.

TABLE 1

| Metallic layer formed from | Bonding strength |
| --- | --- |
| Pt metallo-organics paste | 7–13 kg/2 mm-square |
| Pd metallo-organics paste | 7–13 kg/2 mm-square |
| Ni metallo-organics paste | 7–13 kg/2 mm-square |
| Cu metallo-organics paste | 7–8 kg/2 mm-square |
| Au metallo-organics paste | 7–10 kg/2 mm-square |
| Rh metallo-organics paste | 7–10 kg/2 mm-square |
| Ru metallo-organics paste | 7–10 kg/2 mm-square |
| Re metallo-organics paste | 7–10 kg/2 mm-square |
| Co metallo-organics paste | 7–10 kg/2 mm-square |
| Ir metallo-organics paste | 7–10 kg/2 mm-square |
| Thick film paste | 2–3 kg/2 mm-square |
| Plating | 5–7 kg/2 mm-square |

Although the present invention has been described with preferred embodiments, it is to be understood that variations and modifications may be employed without departing from the concept of the invention as defined in the following claims.

What is claimed is:

1. A multilayer ceramic substrate having at least one layer of a first conductor based on a refractory metal as an internal conductor layer and at least one layer of a Cu-based second conductor as a surface conductor layer, wherein the refractory metal is selected from W, Mo, and a mixture of W and Mo, and the second conductor layer is connected to the first conductor layer through a metallic layer formed by coating with a metallo-organics paste containing one or more metals selected from the group consisting of Pt, Pd, Ni, Cu, Au, Rh, Ru, Re, Co, and Ir followed by firing in an inert or reducing atmosphere.

2. A multilayer ceramic substrate according to claim 1 wherein the metallo-organics paste contains one or more metals selected from the group consisting of Pt, Pd, and Ni.

3. A multilayer ceramic substrate according to claim 1 wherein the metallo-organics paste is coated by screen printing.

4. A multilayer ceramic substrate according to claim 1 wherein the metallo-organics paste is coated with a dispenser.

5. A multilayer ceramic substrate according to claim 1 wherein the metallic layer has a thickness in the range of from 0.05 to 5 $\mu$m.

6. A multilayer ceramic substrate according to claim 5 wherein the metallic layer has a thickness in the range of from 1 to 3$\mu$m.

7. A multilayer ceramic substrate according to claim 6 wherein the metallic layer has a thickness of approximately 2 $\mu$m.

8. A multilayer ceramic substrate according to claim 1, wherein a Pt metallic layer derived from the metallo-organics paste is connected to a first W conductor layer via a W-Pt solid solution layer and to a second Cu conductor layer via a Cu-Pt solid solution layer.

* * * * *

UNITED STATES PATENT AND TRADEMARK OFFICE
CERTIFICATE OF CORRECTION

PATENT NO. : 5,156,903
DATED : October 20, 1992
INVENTOR(S) : Takamasa Okumura, et al It is certified that error appears in the above-indentified patent and that said Letters Patent is hereby corrected as shown below:

On the Title Page, Item [73]:

"Nippon Denso" should read --Nippondenso--.

Signed and Sealed this

Nineteenth Day of April, 1994

Attest:

BRUCE LEHMAN

*Attesting Officer*  *Commissioner of Patents and Trademarks*